United States Patent [19]

Kashiro et al.

[11] Patent Number: 4,754,429
[45] Date of Patent: Jun. 28, 1988

[54] CASSETTE TYPE MAGNETIC BUBBLE MEMORY

[75] Inventors: Kouei Kashiro, Kawasaki; Toshiaki Sukeda; Satoru Imai, both of Suzaka; Sakan Takai; Harumi Maegawa, both of Kawasaki, all of Japan

[73] Assignee: Fujitsu Limited, Kawasaki, Japan

[21] Appl. No.: 732,295

[22] Filed: May 9, 1985

[30] Foreign Application Priority Data

May 14, 1984 [JP] Japan ................................. 59-096102

[51] Int. Cl.⁴ .............................................. G11C 19/08
[52] U.S. Cl. ........................................................ 365/1
[58] Field of Search ......................................... 365/1, 2

[56] References Cited

U.S. PATENT DOCUMENTS 4,397,513 8/1983 Clark et al. ................. 339/91 R
4,459,679 7/1984 Sukeda et al. ...................... 365/1
4,630,236 12/1986 Sukeda et al. ...................... 365/1

*Primary Examiner*—James W. Moffitt
*Attorney, Agent, or Firm*—Staas & Halsey

[57] ABSTRACT

A cassette type magnetic bubble memory comprise a bubble memory device including a bubble memory chip and lead terminals; a connector having contacts for electrically connecting the bubble memory device to an outside unit; thin flexible printed substrates for electrically connecting the contacts of the connector to the lead terminals of the bubble memory device; and a cassette case for accommodating therein the bubble memory device, the connector, and the printed substrates. The cassette case has inner walls. Some parts of the inner walls are in contact with at least some parts of an outer face of the bubble memory device to retain the device in the cassette case so that the majority of the outer face of the device is spaced from the majority of the inner walls of the cassette case. The bubble memory device and the connector are arranged in displaced positions along a plane common to the longitudinal direction of insertion of the cassette case into a bubble memory control unit.

24 Claims, 6 Drawing Sheets

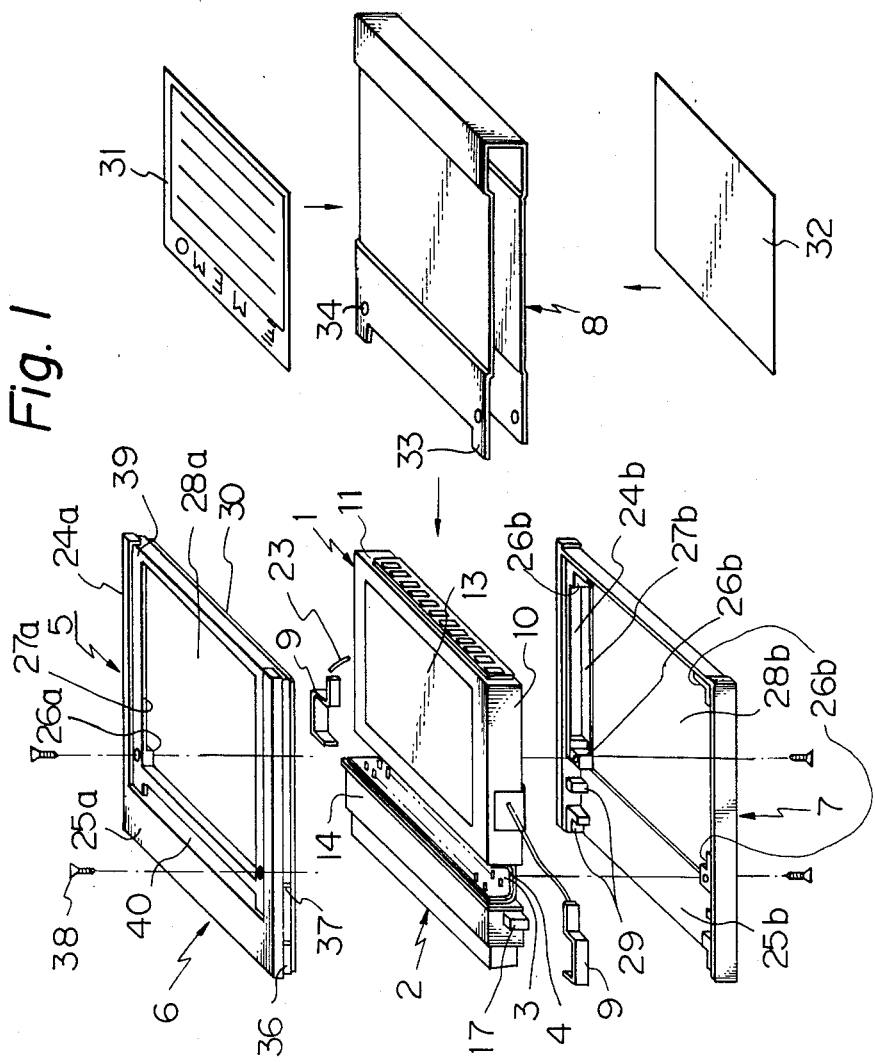

CASSETTE TYPE MAGNETIC BUBBLE MEMORY

BACKGROUND OF THE INVENTION

1. Field of the Invention

The present invention relates to a cassette type bubble memory device, hereinafter referred to simply as a "cassette memory".

Along with integrated circuit (IC) memories and floppy disks, bubble memory devices have come into increased use in recent years. Bubble memory devices have the advantages of: nonvolatile information storage, enabling easy rewriting; a solid chip construction without any mechanically movable parts, enhancing the reliability of the device; and small size and high density, enabling mounting the bubble memory devices on printed circuit boards. Such devices have been recently found to be particularly useful as file memories or program loaders in the field of numerical control (NC) machines, industrial robots, terminal units for manufacturing control point-of-sale (POS) systems, office automation (OA) machines, and so on.

In order to make such bubble memory devices easily transportable in the same manner as floppy disks or cassette tapes, a cassette memory in accordance with the invention comprises a bubble memory device accommodated in a case which can be inserted into a bubble memory control unit.

The cassette memory of the invention is small in size (thickness, width, and length) and light in weight so as to be easily carried by a person who operates these machines or units.

2. Description of the Prior Art

As well known in this field of art, a bubble memory device comprises a shield case of soft magnetic metal for accommodating therein a bubble memory chip, bias magnets, rectifiers, X and Y drive coils for generating a rotating magnetic field for driving bubbles, and, if applicable, release coils for erasing the information stored in the bubble chips.

As also well known, a memory system including a bubble memory device requires a direct peripheral circuit, also referred to as a "linear circuit", for directly driving and controlling the device with analog signals and an indirect peripheral circuit for controlling the direct peripheral circuit with digital signals of a transistor-transistor-logic (TTL) level in accordance with instructions for writing or reading of information from a host system.

The direct peripheral circuit includes a coil drive circuit for driving and controlling the bubble memory chips by supplying a predetermined current, i.e., analog signals, to the drive coils or memory chips, a function drive circuit, and a sense amplifying circuit for amplifying the sensed output voltage at a voltage level of a few mV from a detector in the bubble memory chips and converting in into TTL level.

The indirect peripheral circuit includes a bubble control circuit for controlling the drive of the bubble memory chips by inputting various control digital signals to the direct peripheral circuit in accordance with the instructions for writing or reading information from the host system and outputting the digital sensed signals from the direct pheripheral circuit (sense amplifier circuit) to the host system.

One prior art cassette memory, such as disclosed in Japanese Unexamined Utility Model Publications (Kokai) Nos. 56-56098 and 56-56099, is constructed with the bubble memory device and outside lead connector both mounted on a solid printed substrate (a printed substrate with no flexibility) and accommodated in a plastic or metal case. The printed substrate may be provided with a direct peripheral circuit (sense amplifier circuit) as well as the memory device. The cassette memory thus constructed can be detachably inserted into a receiving connector of a magnetic bubble memory control unit provided with direct and indirect peripheral circuits.

In this cassette memory, the printed substrate usually has a thickness of 0.8 to 1.6 mm. The lead terminals of the device are formed with a "stand off" so as to position the device about 1 mm above the printed substrate and thus improve soldering when dipping in solder. The total thickness of the known cassette memory, including the thickness of the printed substrate, the space between the device and the printed substrate, the height of the bubble device, and the thickness of the cassette case, is about 20 mm.

Another cassette memory has been proposed wherein a printed substrate is formed with an opening. The bubble memory device is situated within the opening to obtain a thin cassette memory having a thickness of about 10 mm. In this case, however, the printed substrate has to horizontally extend from the peripheral edges of the device.

SUMMARY OF THE INVENTION

An object of the present invention is to provide a cassette type magnetic bubble memory which is smaller in size and lighter in weight and thus easier to handle than conventional memories.

According to the present invention, there is provided a cassette type magnetic bubble memory including: a bubble memory device including a bubble chip and lead terminals; a connector having contacts for electrically connecting the bubble memory device to an outside unit; printed substrates for electrically connecting the contacts of the connector to the lead terminals of the bubble memory device; and a cassette case for accommodating therein the bubble memory device, the connector, and the printed substrates. The cassette case has inner walls, at least some parts of the inner walls being in contact with at least some parts of an outer face of the bubble memory device to retain the device in the cassette case, so that the majority of the outer face of the device is spaced from the majority of the inner walls of the cassette case.

According to an embodiment of the present invention, the bubble memory device and the connector are arranged at a common horizontal level with respect to the longitudinal direction of the cassette case, the cassette case being insertable into a bubble memory control unit. The connector is arranged in front of the bubble memory device with respect to the longitudinal inserting direction of the cassette case. The bubble memory device has front and rear end faces, with respect to the inserting direction of the cassette case, on which end faces the lead terminals are arranged. The printed substrates include a pair of relatively shorter and longer flexible printed circuit substrates. The lead terminals on the front end face and the lead terminals on the rear end face are connected to the contacts of the connector via the relatively shorter and longer flexible printed substrates, respectively, and the longer flexible printed substrate extends along and over the face of the bubble memory device.

BRIEF DESCRIPTION OF THE DRAWINGS

FIG. 1 is an exploded, perspective view of a cassette type magnetic bubble memory according to the present invention;

FIGS. 2A to 2E are views of the cassette memory shown in FIG. 1, illustrating the connection between a bubble memory device and a connector, wherein FIG. 2A is a plan view thereof, and FIGS. 2B to 2E are views taken along the lines, or as seen from the directions of the arrows designated by B, C, D, and E, respectively, in FIG. 2A;

FIGS. 3A to 3F are views of the cassette memory shown in FIG. 1, illustrating the assembled status thereof, wherein FIG. 3A is a top plan view thereof, FIG. 3B is a bottom plan view thereof, and FIGS. 3C to 3F are side and end elevational views as seen from the directions indicated by the arrows designated C, D, E, and F, respectively, in FIG. 3A;

DESCRIPTION OF THE PREFERRED EMBODIMENTS

Figure 2A:
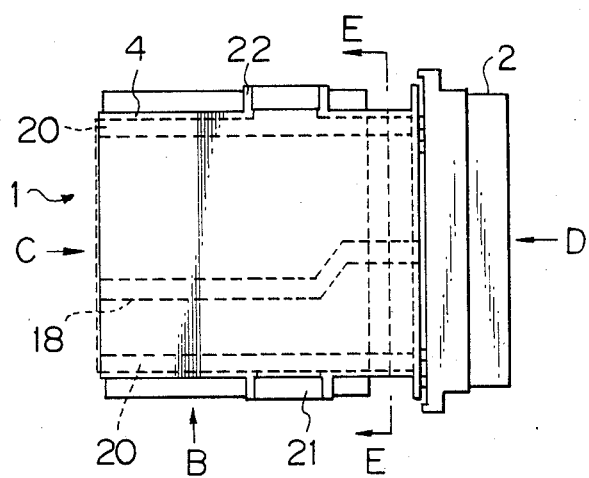

Referring now to FIGS. 1 to 3, a cassette memory of the present invention comprises a bubble memory device 1, an external lead connector 2, flexible printed circuit substrates 3 and 4, a cassette case 5 having an upper case half 6 and a lower case half 7 made of plastic, a metal plate 8 serving as a shield, and ground terminals 9.

The bubble memory device 1 comprises a shield case 10, in which a bubble memory chip (not shown) and the related elements are accommodated, and an inner supporting frame 11 received within shield case 10 and supporting a plurality of lead terminals 12a and 12b protruding from the openings at the respective ends of the shield case 10 to constitute a dual-in-line (DIP) type terminal arrangement. The lead terminals 12a and 12b are each bent in an L-shape at the ends thereof so as not to protrude significantly from the shield case 10. The shield case 10 may have attached on its outer faces sheets 13 indicating the number designations element of inferior loops of the bubble memory chip.

Figure 2B:
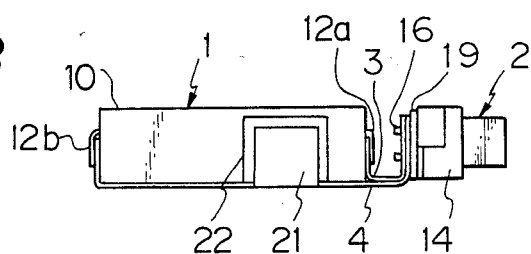

The connector 2 includes a molded elastic element 14 accommodating therein a plurality of female contacts 15 (FIG. 2D) each having an end protruding toward the inner side of the element 14 as a terminal 16 (FIG. 2B). The plastic piece 14 is formed integrally with projections 17 at the respective side walls thereof.

The flexible printed substrates 3 and 4 are made of thin and flexible substrates, as known in the art, formed with conductive patterns therein. One of the substrates, i.e., substrate 3, connects the connector terminals 16 to the connecting lead terminals 12a of the device 1 at the side of the latter which faces the connector 2. The other substrate 4 connects the connector terminals 16 to the other connecting lead terminals 12b of the device 1 at the side opposite the connector 2. The printed substrates 3 and 4 are overlapped, or superposed, at a first of their respective, opposite ends on an insulative plate 19 and adhered thereto as shown in FIG. 2B. The other ends of the substrates 3 and 4 are extended and connected to the respective lead terminals 12a and 12b. The ends of the printed substrates 3 and 4 and the insulative plate 19 are previously formed with holes into which the connecting terminals 16 are inserted. The conductive patterns located at these ends are exposed from the insulative sheet for to allow the terminals 16 to be electrically connected to the conductive patterns by solder dipping. The conductive patterns at the sides of the printed substrate 4 are formed as ground patterns 20 (FIG. 2A) having ear-shaped exposed terminals 22 at the respective ends 21 thereof. The terminals 22 are connected through lead lines 23 to the ground terminals 9 (FIG. 1).

The upper and lower case halves 6 and 7 of the cassette case 5 are both substantially U-shaped in cross-section, so that the device 1 and the connector 2 are supported and secured in predetermined positions between the upper and lower case halves 6 and 7 by assembling and securing them together. Consequently, the upper and lower case halves 6 and 7 are provided in their inside areas with securing portions 24a and 24b respectively, adjacent the parallel longitudinal edges thereof for receiving and therebetween securing the device 1 and with portions 25a and 25b, respectively, for receiving and securing the connector 2 therebetween.

The securing portions 24a and 24b include a pair of projections 26a and 26b, respectively, at the opposite ends thereof. Thus, each of the upper and lower case halves 6 and 7 has four such projections 26a and 26b, respectively, which engage the corresponding four corners of the shield case 10 of the device 1 on the respective, vertical corner surfaces thereof. The securing portions 24a and 24b further include corresponding, longitudinally extending projections 27a and 27b. Thus, the upper case 6 has two such projections 27a and the lower case 7 has to such projections 27b, respectively, engaging the upper and lower horizontal faces of the shield case 10 of the along the corresponding longitudinal edges thereof. These projections 26a, 26b, and 27a, 27b are formed integrally with the upper and lower case halves 6 and 7, respectively. The securing portions 24a and 24b define therebetween openings 28a and 28b comprising the majority of the corresponding areas of the front and back faces of the device 1.

The securing portion 25b of the lower case half 7 is formed with a pair of projections 29 at its opposite ends, between each of which a corresponding one of the pair of projections 17 provided at the opposite side ends of the connector 2 is inserted. In addition, the molded body 14 of the connector 2 is also fixed between the upper and lower case halves 6 and 7 in the securing section 25 (FIG. 3F) formed by securing portions 25a and 25b, the latter best seen in FIG. 1. One of the upper and lower case halves 6 and 7 has also a projecting flap 30 formed along the periphery of the abutting face thereof and used for adhering the two case halves 6 and 7.

The metal plate 8, made of, for example, a steel strip, is bent into a substantially U-shaped section, the outer faces thereof being able to accommodate the attachment thereto of a memo sheet 31 or another sheet 32 for indicating, for instance, the type of the device. The metal plate 8 is also provided at the ends thereof with grounding projections 33 and screw holes 34 for detachably mounting the metal plate 8 onto the case 5 by means of screws 38.

The steps for assembly of the cassette case according to the present invention will now be described in detail.

Figure 2C:
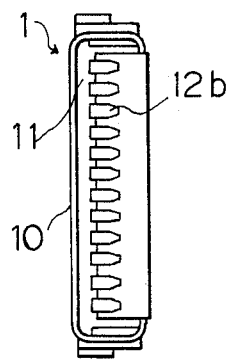
Figure 2D:
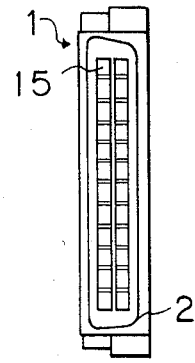
Figure 2E:
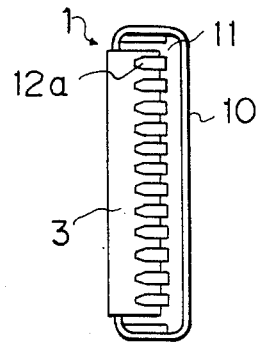

First, the bubble memory device 1 is connected to the connector 2 by means of the flexible printed substrates 3 and 4, which are provided at their common first ends with the insulative plate 19. The other ends of these printed substrates 3 and 4 are inserted into the spaces defined between the supporting frame 11 and the lead terminals 12a and 12b, respectively, the former at the side of device 1 adjacent to the connector 2 as shown in FIG. 2E, and the latter, at the opposite side thereof, as shown in FIG. 2C. The spaces are the same as the thickness of the printed substrates 3 and 4, so that the latter are held in position once inserted into the spaces. Then, the connecting lead terminals 12a and 12b are electrically connected by soldering to the signal conducting patterns 18 (FIG. 2A) or the ground patterns 20 of the printed substrates 3 and 4. On the other hand, the connecting terminals 16 of the connector 2 are inserted through the insulative plate 19 into the holes at the first ends of the printed substrates 3 and 4.

Thus, as shown in FIGS. 2A to 2E, one printed substrate 3 connects the connector 2 to the lead terminals 12a of the device 1 at the end thereof adjacent to the connector 2. On the other hand, the other printed substrate 4 extends along and over the bottom surface of the device 1 and connects the connector 2 to the lead terminals 12b of the device 1 at the opposite end thereof, remote from the connector 2.

Then, the ground terminals 9 are attached to the device 1. Thus, an assembly comprising the device 1, the connector 2, and the printed substrates 3 and 4 can be accommodated in the cassette case 5 by enclosing these interior elements within the upper and lower case halves 6 and 7. Consequently, the device 1 is located in the space between securing portions 24a and 24b such that the four corners and the upper and lower walls of the device 1 are supported and embraced by the projections 26b and 27b, respectively. Then, the connector 2 is, on the other hand, placed on the securing section 25a such that the projections 17 of the connector 2 are supported and embraced between the projections 29 of the lower case half 7. The ground terminals 9 are inserted into slits 37 at the step portions 36 providing case guide slots 35 (FIG. 3C) at the respective sides of the cassette case 5. The portion of each ground terminal 9 which is to be connected to the lead line 23 is positioned inside the case 5. The face of the terminal 9 is exposed in the step portion of the guide grooves 35 (FIG. 3C), such that the ground terminal 9 is connected to the ground of the bubble memory control unit or cassette body (not shown) before the connector 2 is connected to the corresponding connector in the cassette body, when the cassette case 5 is inserted into the cassette body (not shown).

Then, the upper and lower case halves 6 and 7 are assembled and secured together by hot melting the peripheral flap 30 with the help of ultrasonic welding, so that the device 1 and the connector 2 are secured within and to the cassette case 5.

Then, the U-shaped metal plate 8 is fitted to the cassette case 5 such that the plate 8 covers the upper and lower openings 28a and 28b and embraces the case halves 6 and 7. The metal plate 8 is then fixed to the cassette case 5 by means of screws 38. In this state, the metal plate 8 is locsated on the outer surfaces of the longitudinal projections 27a and 27b and thus defines spaces between the upper and lower faces of the device 1 and the corresponding interior surfaces of the metal plate 8 corresponding to the thickness of the respective longitudinal projections 27a and 27b. The metal plate 8 also serves as a handling portion for an operator who handles this cassette memory.

The upper and lower case halves 6 and 7 are provided with recesses 39 as shown in FIG. 1 for guiding the metal cover plate 8 so it does not come out from the surfaces of the cassette case 5. Also, the upper case half 6 is provided with a transverse slot 40 (FIG. 1) which is engaged with a retaining member (not shown) in the cassette body to prevent the cassette memory from coming out while the memory is inserted into the cassette body.

Figure 3A:
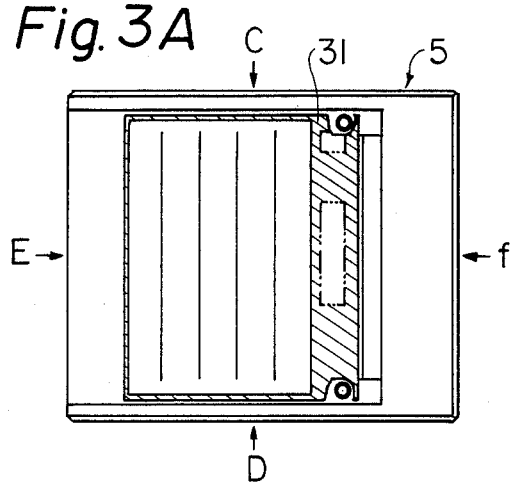
Figure 3E:
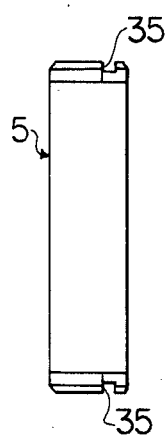
Figure 3B:
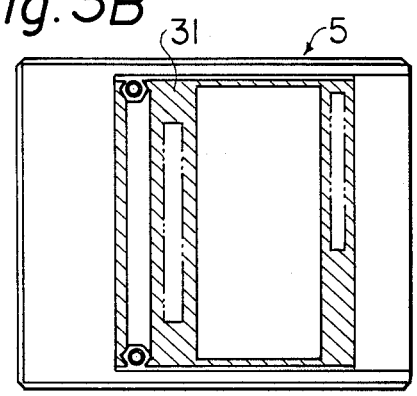
Figure 3C:
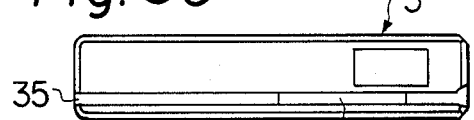
Figure 3D:
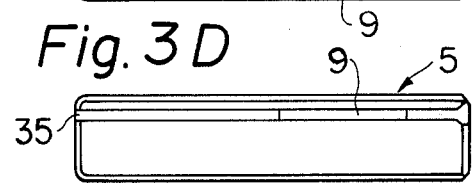
Figure 3F:
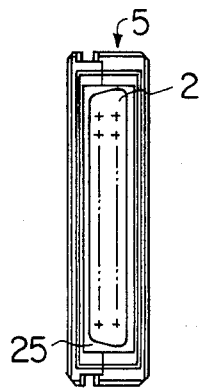

Finally, the sheets 31 and 32 are attached to the surfaces of the metal cover plate 8 so as to cover the screw heads, although the latter are seen in FIGS. 3A and 3B. Thus, a cassette memory as shown in FIGS. 3A to 3F is assembled.

Figure 4:
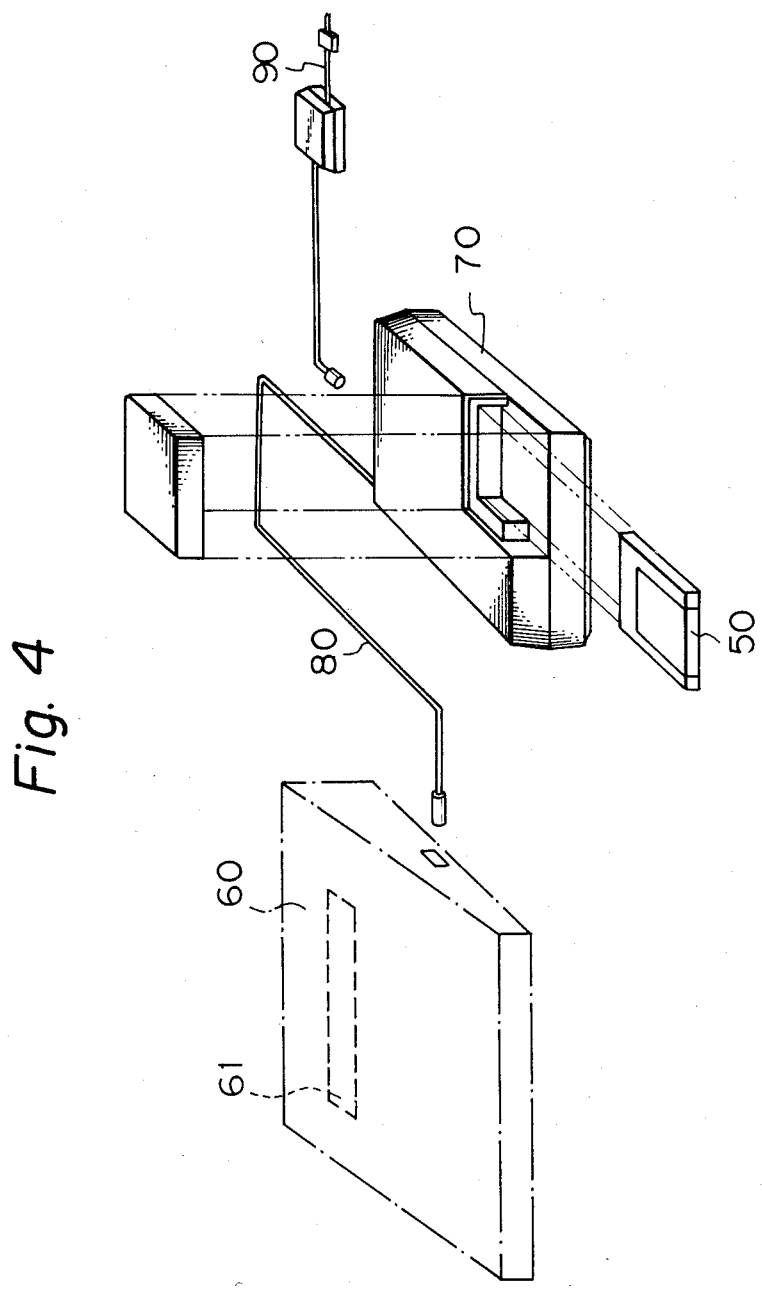
FIG. 4 is a schematic perspective view illustrating the use of a cassette memory according to the present invention in a memory control unit.

FIG. 4 illustrates an example of use of a cassette memory according to the present invention, wherein the cassette memory in question is indicated by reference numeral 50. A host system 60 is a small sized portable word processor including a display 61, and a keyboard, printer, and so on (not illustrated). A bubble memory control unit 70 controls the reading and writing in the device 1 of the cassette memory 50 in accordance with word processing signals and control signals (e.g., for writing, deletion, correction, and etc.) from the host system 60.

Figure 5:
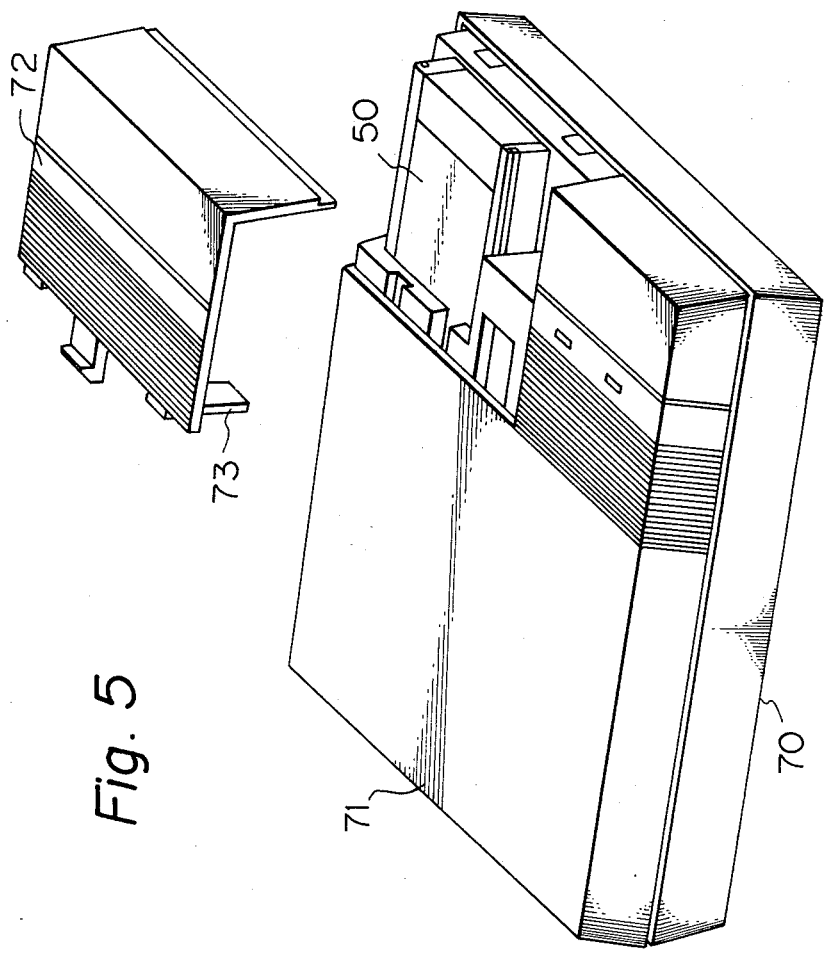
FIG. 5 is an enlarged perspective view of the memory control unit shown in FIG. 4.

FIG. 5 is an enlarged perspective view of the memory control unit 70, which includes in its housing 71 various circuits. One of the corners of the housing 71 is formed by a detachable cover 72. Inside the housing 71, in the recess covered by the cover 72, there is a connector (not illustrated). A cassette memory 50 is inserted into the housing 71 so that the connector of the cassette memory is connected to the connector in the housing 71. The cover 72 is attached to the housing 71 so that a projection 73 thereof engages with a switch (not shown) for confirming that the cover 72 is closed. The system also includes a connecting cable 80 and an AC power connecting cable (90 FIG. 4).

In this system, cassette memory 50 is used as an external memory. Therefore, the memory control unit 70 includes direct and indirect peripheral circuits, as mentioned above, as well as a DC battery (not shown) and DC/DC converter for powering the direct and indirect peripheral circuits.

In this system, the the control signals for word processing and actual word data are input via the cable 80 into the memory control unit 70, which controls and drives the cassette memory 50 in accordance with the above-mentioned control signals to write the word data in the device, or to read out the recorded data in the device and to transmit the data to the host system 60. The memory control unit 70 can be driven by AC power, if the cable 90 is used.

Figure 6:
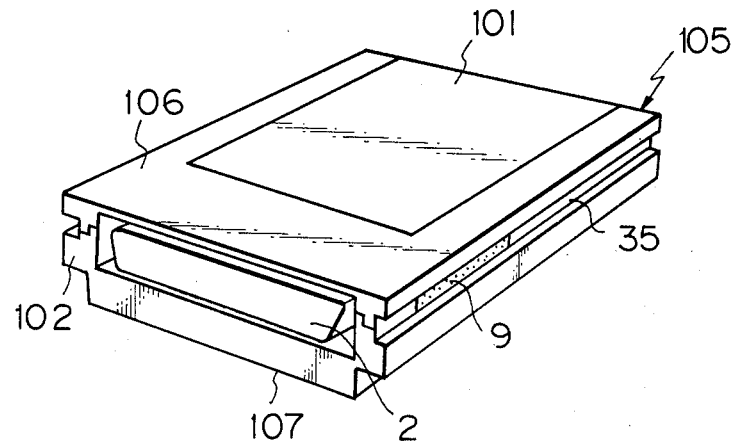
FIG. 6 is a perspective view of another embodiment of a cassette memory according to the present invention.
Figure 7:
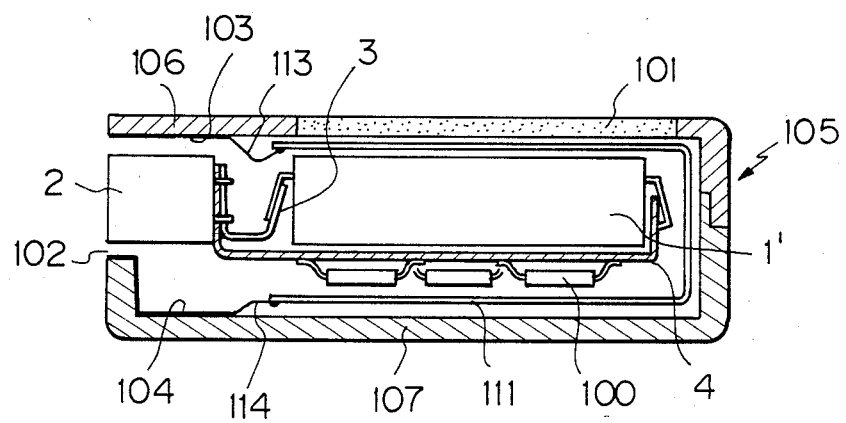
FIG. 7 is a longitudinal cross-sectional view of the cassette memory shown in FIG. 6.

FIG. 6 is a perspectve view illustrating a second embodiment of cassette memory according to the present invention, which is adapted for use for a 4 Mega-bit bubble memory chip. FIG. 7 is longitudinal cross-sectional view of this second embodiment.

In this embodiment, a bubble memory device 1' is connected to a connector 2 by means of two flexible printed substrates 3 and 4 in the same manner as the first embodiment. However, the longer flexible printed substrate 4 is provided, on its face opposite to the bubble memory device 1, with mini-flat IC's 100, which are so-called function IC's, such as sense selectors or function selectors, for adapting the same common connector 2 for different capacities of bubble memory devices. Therefore, if this bubble memory device is used for a 4 Mega-bit memory and if the bubble memory device in the first embodiment is for a one Mega-bit memory, the same connector 2 can be interchangeably used.

A cassette case 105 comprises upper and lower case halves 106 and 107 made of a material such as plastic. The upper case half 106 is substantially the same size as the upper case half 6 (FIG. 1) in the first embodiment, except it has no central opening 28 as in FIG. 1 and is provided instead with a central portion made of a steel plate 101. The lower case half 107 has a larger depth than the lower case half 7 of FIG. 1 in the first embodiment, in order to accommodate therein the mini-flat IC's 100 as mentioned above. The case half 107 has no central opening 28b as does the case half 7 of FIG. 1.

In the cassette case 105 is provided a substantially U-shaped thin metal plate 111 for ground connection, which is arranged along the inner wall of the cassette case 105 so as to cover the bubble memory device 1, the mini-flat IC's 100, and the flexible printed substrates 3 and 4. The upper and lower cassette case halves 106 and 107 are provided, on the inner faces thereof adjacent to a connector opening 102, with conductive metal coatings 103 and 104 which are electrically connected to the respective ends of the metal plate 111 by means of connecting lines 113 and 114. This metal plate 111 has a pair of ear-shaped projections (not shown in the drawings) at both sides thereof adjacent to the ear-shaped exposed terminals 21 (FIGS. 2A and 2B) of the flexible printed substrate 4. These projections are in contact with the exposed terminals 21 of the flexible substrate 4 to be electrically connected to the ground terminals 9 (FIG. 1 and FIG. 6).

The connector 2 and cassette guide grooves 35 are substantially the same in size and arrangement as those of the cassette case 5 in the first embodiment, so this cassette case 105 is insertable into the memory control unit 70 (FIG. 5) in the same manner as the cassette case 5.

In this second embodiment, static electricity transmitted from the operator's hand can be easily discharged through the steel plate 101, the thin metal plate 111, connecting lines 113 and 114, and the metal coating portions 103 and 104 to the outside of the cassette case 105. Therefore, the inner bubble memory device 1' or information stored therein is not affected by such static electricity.

We claim:

1. A magnetic bubble memory cassette comprising:
    a bubble memory device comprising primary outer faces in parallel spaced relationship, and comprising a bubble memory chip and lead terminals;
    a connector having contacts for electrically connecting said bubble memory device to an external bubble memory control unit adapted to receive said cassette by insertion of same thereinto in a predetermined longitudinal direction;
    printed circuit substrates for electrically connecting said contacts of said connector to said lead terminals of said bubble memory device; and
    cassette case for accommodating therein said bubble memory device, said connector, and said printed substrates, said cassette case having inner walls, at least some parts of said inner walls being in contact with at least some parts of corresponding, said primary outer faces of said bubble memory device to retain said device in said cassette case with the majority of the area of said primary outer faces of said device spaced from the majority of the area of said corresponding inner walls of said cassette case;
    said connector being positioned in front of said bubble memory device with respect to the longitudinal direction of insertion of the cassette case;
    said bubble memory device having front and rear end faces, with respect to the direction of insertion of said cassette case, on which end faces said lead terminals are arranged;
    said printed circuit substrates comprising a first, relatively shorter, flexible printed circuit substrate and a second, relatively longer, flexible printed circuit substrate;
    said lead terminals on said front end face and said lead terminals on said rear end face being connected to the contacts of said connector via said first and second flexible printed substrates, respectively;
    said second flexible printed circuit substrate extending along and over one of said primary faces of said bubble memory device.

2. A bubble memory cassette as recited in claim 1, wherein at least one of said printed circuit substrates has a ground pattern, and wherein said cassette case is made from a plastic material and further comprises a ground terminal exposed on the exterior of said cassette case, and means for electrically connecting said ground terminal to said ground pattern of said at least one of said printed circuit substrates.

3. A bubble memory cassette as recited in claim 2, wherein said cassette case comprises exterior, longitudinal side faces with guide grooves formed therein along which said cassette case is insertable into a bubble memory control unit, and wherein said ground terminal is positioned in at least one of said guide grooves.

4. A magnetic bubble memory cassette as recited in claim 3, wherein:
    said cassette case comprises upper and lower case halves, each of plastic material, which are joined together.

5. A bubble memory cassette as recited in claim 4, wherein each of said upper and lower case halves comprises inner faces having integrally formed protruding portions for engaging said at least some parts of said bubble memory device and said connector for retaining and fixedly positioning both said bubble memory device and said connector within said cassette case.

6. A bubble memory cassette as recited in claim 4, wherein said upper and lower case halves are joined together by ultrasonic welding.

7. A bubble memory cassette as recited in claim 4, wherein said upper and lower case halves are joined together by adhesive.

8. A bubble memory cassette comprising:
    a bubble memory device comprising primary outer faces in parallel, spaced relationship, and comprising a bubble memory chip and lead terminals;
    a connector having contacts for electrically connecting said bubble memory device to an external unit adapted to receive said cassette by insertion of same thereinto in a predetermined longitudinal direction;

printed circuit substrates for electrically connection said contacts of said connector to said lead terminals of said bubble memory device;

a cassette case comprising upper and lower case halves, each of plastic material, which are joined together for accommodating therein said bubble memory device, said connector, and said printed substrates, said cassette case having inner walls, at least some parts of said inner walls being in contact with at least some parts of corresponding, said primary outer faces of said bubble memory device to retain said device in said cassette case with the majority of the area of said primary outer faces of said device spaced from the majority of the area of said corresponding inner walls of said cassette case; and a sheet for indicating the identifying numbers of inferior loops in said bubble memory device, said sheet being attached on one of said primary faces of said bubble memory device, at least the corresponding one of said upper and lower case halves having an opening through which said indicating sheet is visible.

9. A bubble memory cassette comprising:

a bubble memory device comprising primary outer faces in parallel, spaced relationship, and comprising a bubble memory chip and lead terminals;

a connector having contacts for electrically connecting said bubble memory device to an external unit adapted to receive said cassette by insertion of same thereinto in a predetermined longitudinal direction;

printed circuit substrates for electrically connection said contacts of said connector to said lead terminals of said bubble memory device;

a cassette case comprising upper and lower case halves, each of plastic material, which are joined together for accommodating therein said bubble memory device, said connector, and said printed substrates, said cassette case having inner walls, at least some parts of said inner walls being in contact with at least some parts of corresponding, said primary outer faces of said bubble memory device to retain said device in said cassette case with the majority of the area of said primary outer faces of said device spaced from the majority of the area of said corresponding inner walls of said cassette case;

said upper and lower case halves having openings at positions corresponding to a majority of the area of said primary outer faces of the bubble memory device; and a metal cover plate having interconnected, parallel plate portions mounted on said cassette case with said parallel plate portions covering respective ones of said openings in parallel relationship to and spaced from the corresponding said primary outer faces of said device.

10. A bubble memory cassette as recited in claim 9, wherein said metal plate for covering said openings is detachably mounted on said cassette case.

11. A bubble memory cassette as recited in claim 9, wherein said metal cover plate comprises a single sheet of metal bent in a substantially U-shaped configuration to define said interconnected, parallel plate portions, said cover plate being detachably mounted on said cassette case by said interconnected parallel plate portions being slid over and grasping the corresponding said upper and lower case halves.

12. A bubble memory cassette as recited in claim 9, further comprising a sheet for indicating the identifying numbers of inferior loops in said bubble memory device, said sheet being attached on one of said primary outer faces of said bubble memory device, thereby to be visible through the corresponding one of said openings of said upper and lower case halves.

13. A bubble memory cassette as recited in claim 15, further comprising a metal ground plate having interconnected portions respectively parallel to said primary outer faces and said rear end face of said device, said ground plate encompassing therewithin said printed circuit substrates, said integrated circuit elements and said memory device and being received therewith in said cassette case.

14. A bubble memory cassette as recited in claim 13, wherein at least said second printed circuit substrate has an electrical ground printed circuit pattern therein, said cassette case is made from a plastic material and further comprises a ground terminal exposed on the exterior of said cassette case, and there is further provided means for electrically connecting said ground metal plate to said ground terminal and to said ground pattern of said second printed circuit substrate.

15. A magnetic bubble memory cassette comprising:

a bubble memory device comprising primary outer faces in spaced relationship, and comprising a bubble memory chip and lead terminals;

a connector having contacts for electrically connecting said bubble memory device to an external bubble memory control unit adapted to receive said cassette by insertion of same thereinto in a predetermined longitudinal direction;

printed circuit substrates for electrically connecting said contacts of said connector to said lead terminals of said bubble memory device; and a cassette case for accommodating therein said bubble memory device, said connector, and said printed circuit substrates, said cassette case having inner walls, at least some parts of said inner walls being in contact with at least some parts of corresponding, said primary outer faces of said bubble memory device to retain said device in said cassette case with the majority of the area of said primary outer faces of said device spaced from the majority of the area of said corresponding inner walls of said cassette case; and integrated circuit elements;

said connector being positioned in front of said bubble memory device with respect to the longitudinal direction of insertion of the cassette case;

said bubble memory device having front and rear end faces, with respect to the direction of insertion of said cassette case, on which end faces said lead terminals are arranged;

said printed circuit substrates comprising a first, relatively shorter, flexible printed circuit substrate and a second, relatively longer, flexible printed circuit substrate;

said lead terminals on said front end face and said lead terminals on said rear end face being connected to the contacts of said connector via said first and second flexible printed circuit substrates, respectively;

said second flexible printed circuit substrate extending along and over one of said primary faces of said bubble memory device and displaced from the corresponding inner surface of said cassette case; and said integrated circuit elements being mounted on said second flexible printed substrate on the surface thereof opposite to said bubble memory device and displaced from said corresponding inner surface of said cassette case, thereby to accommodate said circuit elements within said cassette case.

16. A magnetic bubble memory cassette comprising:

a device for supporting therewithin a bubble memory chip, said device being of generally flat, rectangular configuration and comprising a pair of parallel, spaced primary outer faces, a pair of spaced, parallel, longitudinal side faces perpendicular to said primary outer faces and a pair of parallel, front and rear end faces extending perpendicularly to said longitudinal side faces and said primary outer faces;

lead terminals mounted on said front and rear end faces of said device for electrical connection to a bubble memory chip supported within said device;

a connector having contacts for electrical connection to an external unit adapted to receive said cassette by insertion of same thereinto in a predetermined direction;

first and second printed circuit substrates for electrically connecting said contacts of said connector to said lead terminals; and a cassette case of generally flat, rectangular configuration for accommodating therein said device, said printed circuit substrates, and said connector, said case comprising a pair of spaced, longitudinal sidewalls corresponding to said pair of longitudinal side faces of said device and having respective front and rear ends, a rear end wall extending perpendicularly between said longitudinal sidewalls and joined thereto at the corresponding rear ends thereof, and a pair of generally planar elements extending in parallel, spaced relation between said longitudinal sidewalls and joined at the respective ends thereof to the corresponding said longitudinal side walls adjacent the front ends thereof, thereby to define an open front end of said case, said connector being received between and engaged by said longitudinal sidewalls and said generally planar elements of said case at said open front end thereof to afford external access to said contacts of said connector, and said device being received between and engaged by said longitudinal sidewalls of said case with said rear end face of said device disposed adjacent said closed rear end wall of said cassette case and said front end face thereof disposed adjacent to, but spaced from, said connector;

said first printed circuit substrate connecting said terminals on said front end face of said device to corresponding contacts of said connector;

said second printed circuit substrate connecting said terminals on said rear end face of said device to corresponding contacts of said connector and extending therebetween in overlying and closely spaced relationship with one of said primary outer faces of said device.

17. A magnetic bubble memory cassette as recited in claim 16, wherein said device comprises:

a frame of insulating material defining at least said front and rear end faces thereof on which said lead terminals are mounted; and a metallic shield case surrounding said frame and defining said primary outer faces and said longitudinal side faces of said device.

18. A magnetic bubble memory cassette as recited in claim 16, wherein:

each of said longitudinal sidewalls of said cassette case includes a longitudinally extending groove on the exterior surface thereof for mechanical alignment of said cassette when inserted into a receiving device therefor; and there is further provided:

at least one electrical ground terminal received within a corresponding one of said longitudinal grooves and disposed to be contacted by a corresponding contact element within said receiving device; and means for electrically connecting said electrical ground terminal and said metallic electrical shield.

19. A magnetic bubble memory cassette as recited in claim 16, wherein:

said longitudinal sidewalls, said rear end wall, and said pair of parallel planar elements define openings on each of the opposite surfaces of said cassette case through which a major portion of the primary outer faces of said device are visible, and there is further provided:

a metal cover plate of generally U-shaped configuration in cross section and comprising first and second interconnected, parallel metal plates adapted to be received over said case to cover said openings, each said metal plate of said cover being spaced from the corresponding said primary surface of said device by at least the thickness of said longitudinally extending protrusions.

20. A magnetic bubble memory cassette as recited in claim 16, further comprising:

a pair of spaced, parallel longitudinal protrusions integrally formed with and extending inwardly from each of said longitudinal sidewalls for receiving therebetween and engaging peripheral portions of said primary outer faces of said device adjacent the longitudinal side faces thereof;

corner projections integrally formed with and extending inwardly from said longitudinal sidewalls at the junctures of the respective rear ends thereof and said closed end wall, and at intermediate portions of said longitudinal sidewalls, so as to engage the corresponding corners of said generally rectangular device.

21. A magnetic bubble memory cassette as recited in claim 20, further comprising:

a projection formed integrally with and extending from each of said opposite ends of said connector; and a pair of projections integrally formed with and extending inwardly from each of said longitudinal sidewalls adjacent said second respective ends thereof and between said planar elements for receiving therebetween the corresponding said projections on the opposite ends of said connector.

22. A magnetic bubble memory cassette as recited in claim 21, wherein said cassette case comprises upper and lower portions between which said bubble memory device frame, said substrates and said connector are assembled, said upper and lower portions of said cassette case being integrally joined about said longitudinal sidewalls and said closed end wall thereof to secure said bubble memory device, said substrates, and said connector therewithin.

23. A magnetic bubble memory cassette as recited in claim 16, wherein:
  said connector comprises an inner surface extending parallel to and spaced from said front end face of said device when assembled within said cassette case, said contacts of said connector including contact portions extending inwardly of said inner face of said connector and toward said front end face of said device; and
  said first and second printed circuit substrates are superposed at first ends thereof onto said inner face of said connector for electrical connection of the printed circuits thereof to respectively corresponding ones of said contact portions.

24. A magnetic bubble memory cassette as recited in claim 23, wherein:
  said terminals on said front and rear end faces of said frame comprises L-shaped electrical connectors extending from said front and rear end faces of said device so as to define a narrow gap between the major leg of each such L-shaped connector and the corresponding said front and rear end faces; and
  a second end portion of each of said first and second substrates is received in the gaps between said front and rear end faces, respectively, and the major legs of the corresponding L-shaped connectors thereon, thereby being mechanically secured in position and completing electrical connections between the respective printed circuits of said first and second printed circuit substrates and the corresponding said L-shaped connector terminals of said front and rear end faces of said device.

* * * * *

UNITED STATES PATENT AND TRADEMARK OFFICE
CERTIFICATE OF CORRECTION

PATENT NO. : 4,754,429
DATED : June 28, 1988
INVENTOR(S) : Kouei KASHIRO et al.

It is certified that error appears in the above-identified patent and that said Letters Patent is hereby corrected as shown below:

Front Page, [57] Abstract, line 1, change "comprise" to --comprises--.

Col. 3, line 55, change "elastic" to --plastic--.

Col. 4, line 26, after "24b" insert a comma --,--.

Col. 6, line 1, change "locsated" to --located--;

line 5, change "thickness" to --thicknesses--;

line 62, change "perspectve" to --perspective--.

Col. 8, line 45, change "3" to --1--.

Col. 9, line 3, change "connection" to --connecting--;

line 35, change "connection" to --connecting--;

Col. 10, line 10, change "13" to --14-- and change "15" to --13--;

line 18, change "14" to --15-- and change "13" to --14--;

UNITED STATES PATENT AND TRADEMARK OFFICE
CERTIFICATE OF CORRECTION

PATENT NO. : 4,754,429

DATED : June 28, 1988

INVENTOR(S) : Kouei KASHIRO et al.

It is certified that error appears in the above-identified patent and that said Letters Patent is hereby corrected as shown below:

Col. 10, line 27, change "15" to --13--.

Signed and Sealed this

Seventh Day of February, 1989

Attest:

DONALD J. QUIGG

Attesting Officer      Commissioner of Patents and Trademarks